US005936713A

United States Patent [19]

Paufler et al.

[11] Patent Number: 5,936,713

[45] Date of Patent: Aug. 10, 1999

[54] METHOD AND DEVICE FOR PRODUCING FEATURES ON A PHOTOLITHOGRAPHIC LAYER

[75] Inventors: Jörg Paufler, Bischofswerda; Rolf Seltmann, Dresden; Heinz Kück, Langebrück, all of Germany

[73] Assignee: Fraunhofer-Gesellschaft Zur Förderung Der Angewandten Forschung E.V., Munich, Germany

[21] Appl. No.: 08/973,805

[22] PCT Filed: Apr. 25, 1996

[86] PCT No.: PCT/EP96/01737

§ 371 Date: Jan. 29, 1998

§ 102(e) Date: Jan. 29, 1998

[87] PCT Pub. No.: WO97/01130

PCT Pub. Date: Jan. 9, 1997

[30] Foreign Application Priority Data

Jun. 23, 1995 [DE] Germany .......................... 195 22 936

[51] Int. Cl.[6] .......................... G03B 27/54; G03B 27/52; G03B 27/42

[52] U.S. Cl. ................................ 355/67; 355/40; 355/43; 355/53

[58] Field of Search ................................ 355/40, 67, 53, 355/71; 359/569; 430/394, 396; 353/33

[56] References Cited

U.S. PATENT DOCUMENTS

| | | | |
|---|---|---|---|
| 5,132,723 | 7/1992 | Gelbart | 355/40 |
| 5,296,891 | 3/1994 | Vogt et al. | 355/67 |
| 5,298,365 | 3/1994 | Okamoto et al. | 430/311 |
| 5,369,464 | 11/1994 | Kamon | 355/43 |
| 5,760,960 | 6/1998 | Lin et al. | 359/569 |

FOREIGN PATENT DOCUMENTS

| | | | |
|---|---|---|---|
| 0 632 330 A2 | 1/1995 | European Pat. Off. | 7/20 |
| WO 93/09472 | 5/1993 | Germany | 7/20 |
| 2215553 | 9/1989 | United Kingdom | 1/40 |
| WO 94/24610 | 10/1994 | WIPO | 7/20 |

*Primary Examiner*—Safet Metjahic
*Assistant Examiner*—Peter Kim
*Attorney, Agent, or Firm*—Duft, Graziano & Forest, P.C.

[57] ABSTRACT

In a method for structuring a photolithographic layer a first pattern is created on a first plane light modulator. The first plane light modulator comprises a plurality of picture elements, and the first pattern is defined by a prescribed number of addressed picture elements. Then a second pattern is created on a second plane light modulator. The second plane light modulator comprises a plurality of picture elements, and the second pattern has a first region of addressed picture elements, which matches the first pattern or part thereof, and immediately adjacent to this a second region of addressed picture elements. Finally the first and the second pattern are imaged onto a region to be exposed of the layer to be structured.

15 Claims, 4 Drawing Sheets

PLANE LIGHT MODULATOR
EXPOSED REGION
100a
102a
100
100c
102
102c
102b
104
104b
104a
PLANE LIGHT MODULATOR
AFTER IMAGING OPTICAL SYSTEM
I
x
$I_1$
$I_1/2$
$I_2$
$I_2/2$
$\frac{I_1+I_2}{2}$
INTENSITY LIMIT FOR EXPOSURE

=

+

METHOD AND DEVICE FOR PRODUCING FEATURES ON A PHOTOLITHOGRAPHIC LAYER

BACKGROUND OF THE INVENTION

1. Field of the Invention

The present invention refers to a method and a device for structuring photolithographic layers, particularly for microelectronics, microsystem technology, thin-film technology, the manufacture of flat screens, the direct exposure of semiconductor wafers in the manufacture of semiconductors and the structuring of masks and reticles for microlithographic applications.

2. Description of the Background Art

Exposure devices for the direct exposure of light-sensitive layers are already known in the prior art.

WO 93/09472 describes an exposure device comprising a light source and a pattern generator. The pattern generator includes an optical Schlieren system and an active matrix-addressable plane light modulator. In addition this known exposure device contains a movable positioning table on which a substrate to be exposed may be mounted. The light source used there is a pulsed laser with a pulse duration which is so short that picture fadings affecting the image quality do not occur when the positioning table carrying the substrate is moved continuously during the exposure of a single picture. In this way it is possible to achieve relatively high writing speeds.

WO 91/17483 and WO 93/09469 describe similar exposure devices for the direct exposure of light-sensitive layers, in which this exposure is also achieved using a plane light modulator.

The disadvantage of the exposure devices described above is that due to the size of the picture elements (pixels), in particular due to the width of the picture elements on the plane light modulator and because of the imaging scale of a projection optical system, a structure increment is fixed in advance and cannot be arbitrarily reduced. A structure increment is the smallest amount by which a structure on the substrate to be illuminated can be enlarged or reduced.

In particular, there is a discrepancy between the theoretical structure resolution of a matrix-addressed plane light modulator of one or two pixels and the structure increment of one pixel since nearly all the technologies in a semiconductor process are based on a ratio of the structure increment to the minimum structure size of less than 1:10.

With the exposure devices known in the prior art and described above, the structure increment can only be reduced in a technologically or technically restricted framework by enlarging the imaging scale of the projection optical system or by reducing the width of the picture elements on the plane light modulator.

This leads in both cases to a considerable reduction in the writing speed of the system, which is proportional to the square of the product of the width of the picture element on the plane light modulator and the imaging scale.

A further disadvantage of these known devices is the defect sensitivity of these devices. Because of the size of the plane light modulators which are used, it is not normally possible to exclude defects on the plane light modulator, which means that a number of picture elements cannot be addressed or cannot be addressed completely.

WO 93/09472 solves this problem by ascertaining all the defective picture elements and treating them in such a way that they no longer refelect light. In this known device a structure is created by mutually overlapping partial pictures, so that it is assured that each part of the structure to be exposed is exposed at least once by a functional picture element. This overlapping of two neighbouring single pictures on the substrate leads to a reduction in the writing speed of this known device by a further factor of two.

SUMMARY OF THE INVENTION

It is the object of the present invention to provide a method and a device for structuring a photolithographic layer in which a restriction on the size of a structure increment due to the picture element width of the plane light modulator and due to the imaging scale of the projection objective is removed without adversely affecting the writing speed.

The present invention provides a method for structuring a photolithographic layer, in which a first pattern is created on a first plane light modulator, where the first plane light modulator comprises a plurality of picture elements, where the first pattern is defined by a prescribed number of addressed picture elements; the first pattern is imaged onto a region to be exposed of the layer to be structured; a second pattern is created on a second plane light modulator, where the second plane light modulator comprises a plurality of picture elements, where the second pattern comprises a first region of addressed picture elements, which matches the first pattern or part thereof, and immediately adjacent to this a second region of addressed picture elements; and the second pattern is imaged onto the region to be exposed of the layer to be structured; wherein the first and the second pattern are imaged simultaneously onto the region to be exposed of the layer to be structured.

The present invention provides a device for structuring a photolithographic layer, having a first plane light modulator with a plurality of picture elements for creating a first pattern, which is defined by a prescribed number of addressed picture elements; an imaging device, which images the first pattern onto a region to be exposed of the layer to be structured; and a second plane light modulator with a plurality of picture elements for creating a second pattern, which comprises a first region of addressed picture elements, which matches the first pattern or part thereof, and immediately adjacent to this a second region of addressed picture elements; wherein the imaging device images the second pattern onto the region to be exposed of the layer to be structured; wherein the imaging device images the first and the second pattern simultaneously onto the region to be exposed of the layer to be structured.

The present invention is based on the finding that, due to the finite aperture of the optical imaging device, there is a reduction in the light intensity at the boundaries of the structures, so that an edge which is to be imaged appears “faded”. In connection with the contrast of the resist which is used, which is a measure of the resist removal when the light intensity changes, and the light intensity falling on the resist, the width of the created resist structure can be influenced by a variation in the steepness of the intensity curve at the structure edge to be imaged. In the ideal limiting case of a resist with infinite contrast, there exists a so-called operating intensity of the resist. A structure edge is defined in this case by the point of intersection of the intensity curve and the operating intensity of the resist.

By the imaging of a first pattern and of a second pattern, which matches the first pattern and has a second region of addressed picture elements immediately adjacent thereto, it is possible to define a curve of the light intensity over the boundary region of the structures. As a result it is possible to effect a controlled shift in the edge of the structure, which is determined by the contrast of the resist which is used and the absolute value and the edge steepness of the impinging light intensity. In this way a reduction in the attainable structure increment on the layer to be exposed is achieved without changing the width of the picture elements on the plane light modulator and without changing the imaging scale of the optical imaging device.

In accordance with a further advantage of the present invention, defective picture elements on the plane light modulator are also tolerated as well, so that the full capability of the device according to the present invention is guaranteed without reducing the writing speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
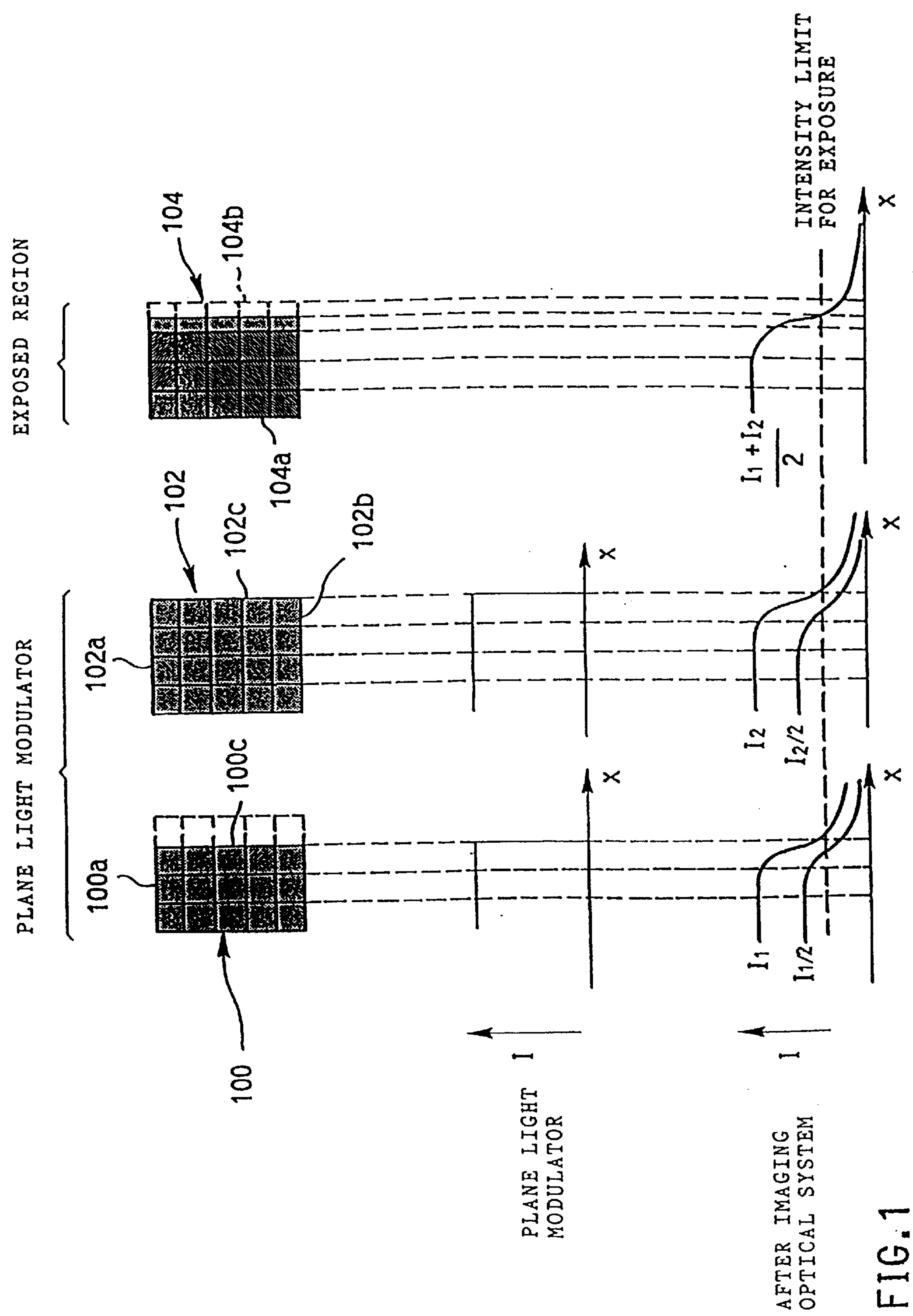
FIG. 1 shows a representation on the basis of which the method according to the present invention will be described.

In FIG. 1 a first pattern 100 and a second pattern 102 are shown. The first pattern 100 is created on a plane light modulator and, in this embodiment, consists of 3×5 addressed picture elements. The second pattern 102 is also created on a plane light modulator and consists of 4×5 addressed picture elements. The second pattern 102 includes a first region 102*a* of 3×5 addressed picture elements, which corresponds to a region 100*a*. Adjacent to this first region 102*a* of the second pattern there is a second region 102*b* with 1×5 addressed picture elements of the second pattern.

In FIG. 1 the resulting exposed region on the layer to be structured is shown as 104. As can be clearly seen, a superposition of the first pattern 100 and of the second pattern 102 results in an exposed region 104, which includes a first section 104*a*, which corresponds to the first pattern 100. In addition there is a second section 104*b* with a width half that of a picture element of the plane light modulator.

The way in which this second section originates will now be explained in more detail in terms of the intensity curves in the lower part of FIG. 1.

The first intensity curve shows the intensity of the light that is reflected from the plane light modulator due to the first or second pattern 100, 102. A sharp transition between picture elements of the plane light modulator which define the first or second pattern and between picture elements of the plane light modulator which do not define any part of the patterns is apparent.

As has already been described above, the imaging optical system has a finite aperture. This results in a “fading” of the originally sharp transition of the light intensity after the plane light modulator.

In FIG. 1 an ideal resist with infinitely high contrast has been assumed in explaining the effect of the intensity curves on the structure edges. As a result, a structure edge is defined by the point of intersection of the intensity curve and the operating intensity.

The intensity curve of the light after passing through the imaging optical system is shown in the lower part of FIG. 1. $I_1$ indicates the light intensity which is necessary to expose the region to be exposed with all 3×5 addressed picture elements of the first pattern 100. $I_2$ indicates the light intensity which is necessary to expose the region to be exposed with all 4×5 addressed picture elements of the second pattern 102.

To effect a controlled shift in the edge 100*c* of the first pattern 100, the patterns 100, 102 are not exposed with the intensities $I_1$, $I_2$ which are needed to image the complete patterns, however, but with lower intensities which lie below the intensities quoted above. The corresponding intensities depend on the resist which is used.

In the example shown in FIG. 1 these are the lower intensities $I_1/2$ and $I_2/2$, respectively.

If each of the patterns 100, 102 is considered individually when using the lower intensities, the intensities quickly fall below the operating intensity of the resist, i.e. only a narrow part of the pattern (3×5 or 4×5) is imaged.

In the case of a superposition of the two patterns, or to be more precise when there is a superposition of the corresponding intensity curves for $I_1/2$ and $I_2/2$, an intensity curve $(I_1+I_2)/2$ results in the exposed region, as is shown at the bottom right in FIG. 1.

This results in a shift in the point of intersection of the intensity curve and the intensity limit.

This results in the exposed region 104 with its first and second sections 104*a*, 104*b*, where the second section 104*b* has a width half that of a picture element of a plane light modulator.

Figure 2:
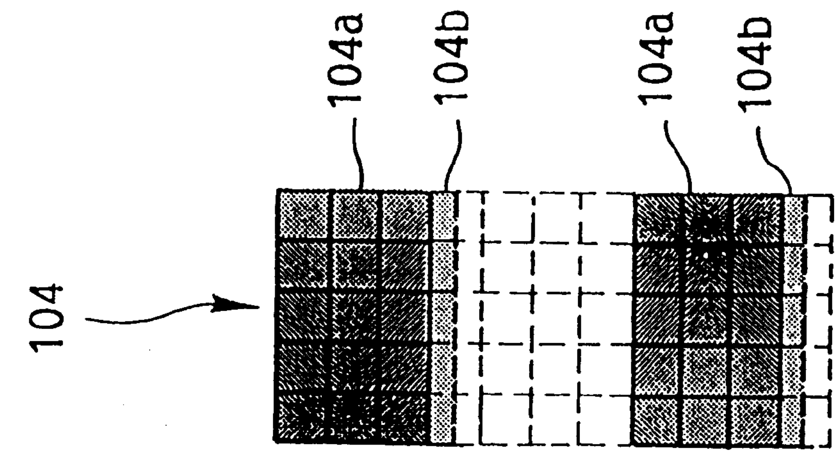
FIG. 2 shows another representation on the basis of which the method according to the present invention will be described.
Figure 2:
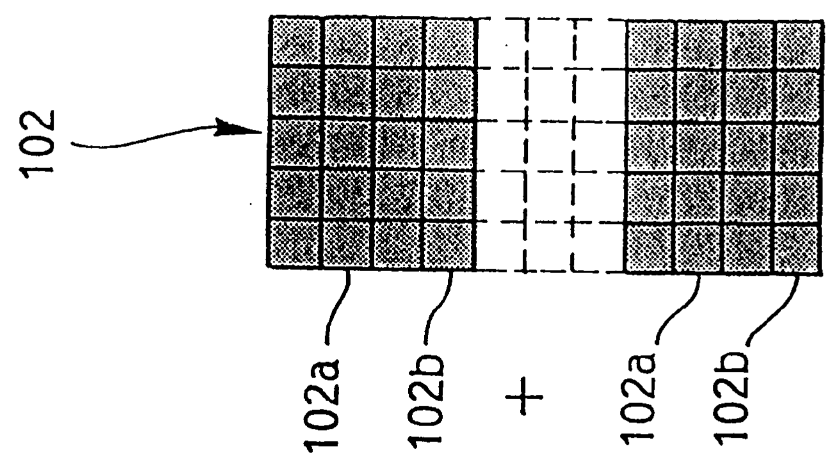
Figure 2:
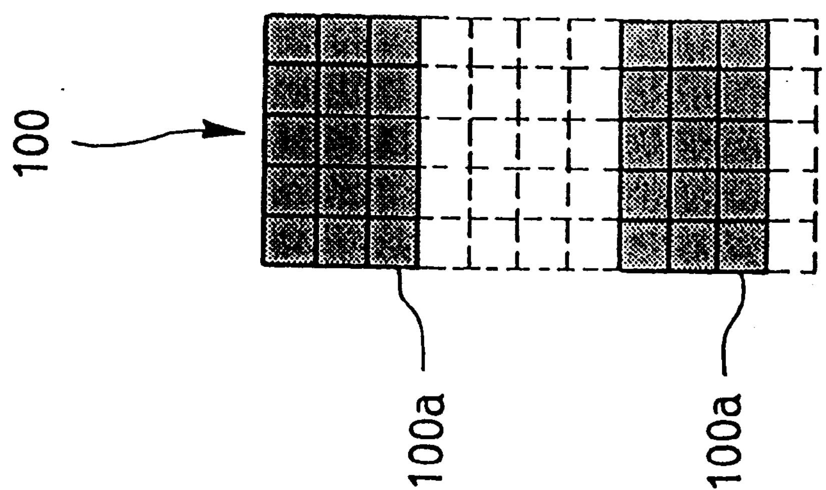

Another example is shown in FIG. 2. The same reference numerals are used in FIG. 2 as in FIG. 1.

As can be seen in FIG. 2, the first pattern 100 now consists of two partial patterns 100*a* and the second pattern 102 correspondingly has two partial patterns. The resulting exposed region 104 likewise has two partial patterns. The plus sign indicates the superposition of the two patterns 100, 102, from which the exposed region 104 results, this being indicated by the equals sign.

A first preferred embodiment of the present invention will now be explained in more detail on the basis of FIG. 3.

The device according to the present invention is designated generally by reference numeral 300. The device 300 includes two plane light modulators 302*a*, 302*b* having a plurality of picture elements. Patterns can be created on these plane light modulators 302 via a control 304 connected to the plane light modulators.

The light emerging from a light source 306, which in this preferred embodiment may be a pulsed laser light source, is projected onto the plane light modulators 302*a*, 302*b* via a beam forming and transmission unit 308*a*–308*e* and via a beam splitting cube 310.

The light reflected from the plane light modulators passes through the beam splitting cube 310 and traverses a so-called projection or imaging optical system 312*a*, 312*b*, 312*c* and falls finally on a region to be exposed 314 of a layer to be structured 316.

In this embodiment the layer to be structured is arranged on a movable positioning table 318.

The beam splitting cube 310 is implemented accordingly so as to split the beam from the light source 306 into two subbeams in order to direct them onto their respective plane light modulator.

In this embodiment the beam splitting cube 310 splits the light from the light source 306, which may also here be a pulsed laser light source, into two subbeams of the same intensity.

In this embodiment the method according to the present invention comprises the following steps:

In a first step a first pattern is created on the first plane light modulator 302*a*, the pattern being defined by a prescribed number of addressed picture elements. In a second step a second pattern is created simultaneously on the second plane light modulator 302*b*, the pattern having a first region of addressed picture elements which matches the first pattern and having a second region of addressed picture elements immediately adjacent to the first region. Afterwards the first and second patterns are imaged onto the region to be exposed 314 of the layer to be structured 316.

In this embodiment the second region of the second pattern may comprise an addressed picture element at right angles to the extension direction of the first region of the second pattern.

To create structures in the region to be exposed whose size is not equal to a multiple of the picture element size on the plane light modulators 302*a*, 302*b*, a first pattern with a width of i addressed picture elements is created on the plane light modulator 302*a* and a second pattern with a width of i+1 addressed picture elements is created on the second plane light modulator. Superposition of the partial pictures so created produces in the region to be exposed a structure with a size of i+0.5 picture elements.

The way in which this structure originates has already been described on the basis of FIGS. 1 and 2.

Figure 3:
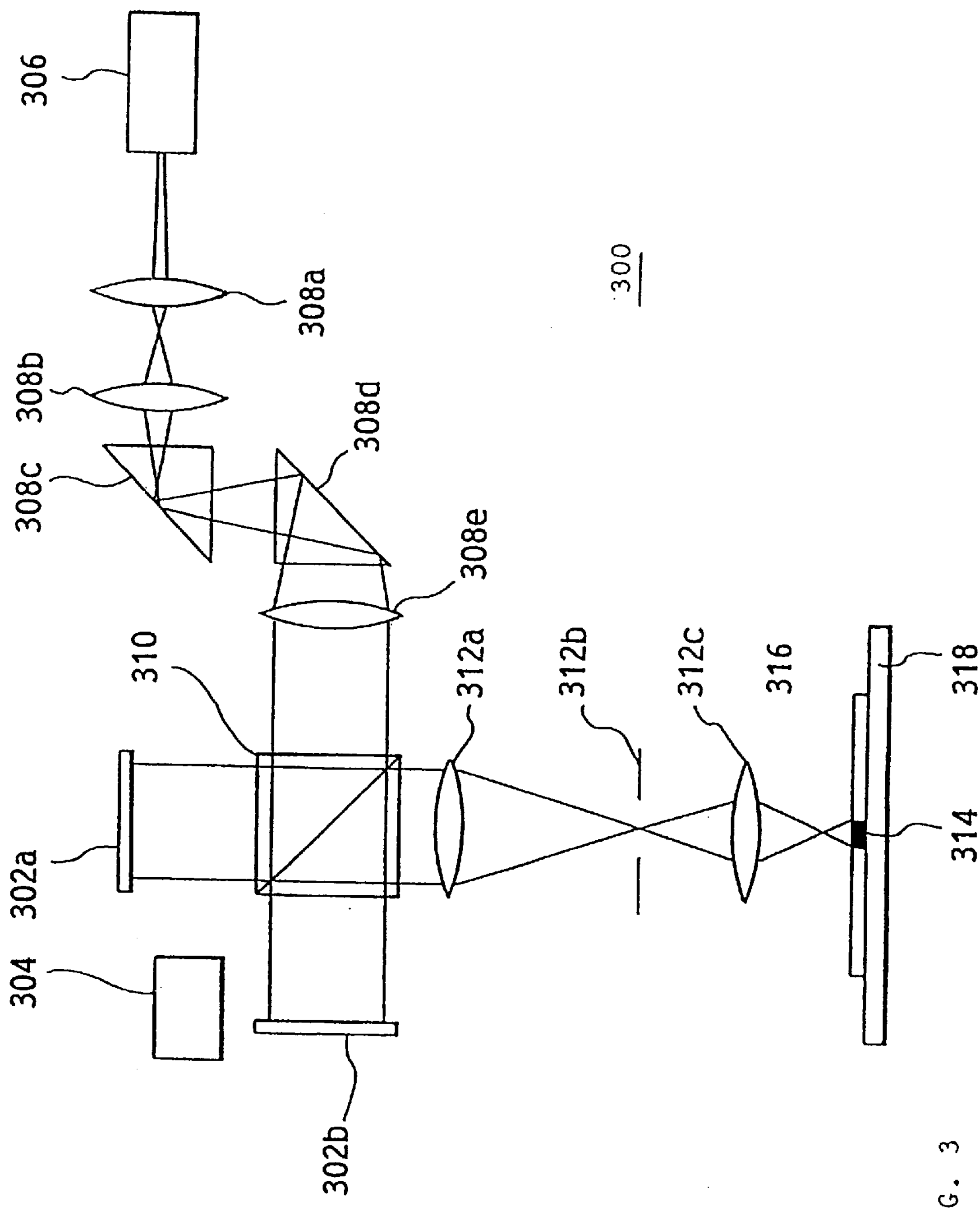
FIG. 3 shows a first embodiment of the device according to the present invention.

If the interference conditions are met in the method that has been described for the device from FIG. 3, it is the coherent superposition of the individual partial pictures which is responsible for creating the complete structure.

To meet these interference conditions, the patterns created or programmed on the plane light modulators must be imaged simultaneously on the substrate to be exposed, the difference in the light paths from the light source, or from different light sources assigned to the individual plane light modulators, via the plane light modulators to the substrate must be less than the coherence length of the light which is used, and the light must come from a light source or from different light sources which can interfere with each other.

The imaging principle then rests on the fact that the superposition, with correct amplitudes and phases, of the light emissions of the individual patterns on the plane light modulator creates a virtual pattern that is imaged onto the substrate. In the boundary regions this pattern exhibits, in addition to the phase modulation, an intensity modulation, as a result of which the structure edge is displaced (see FIG. 1). This can be achieved with the programmed plane light modulators with different programmed patterns described above.

If the interference conditions are not met, the complete structure originates through the incoherent superposition of the individual partial pictures, as has been described on the basis of FIG. 1.

The structure of the individual plane light modulators is such that it is possible with a single partial picture to expose simultaneously and independently of one another in the x- and y-direction regions on the layer to be structured.

Attention is drawn to the fact that the embodiment described in FIG. 3 is not restricted to the use of only one light source 306, but that instead of the one light source 306 for both plane light modulators 302*a*, 302*b* it would also be possible to use two light sources, one of which is assigned to plane light modulator 302*a* and the other to plane light modulator 302*b*.

In this case a suitable optical system would have to be provided to superpose simultaneously the beams reflected from the plane light modulators.

Figure 4:
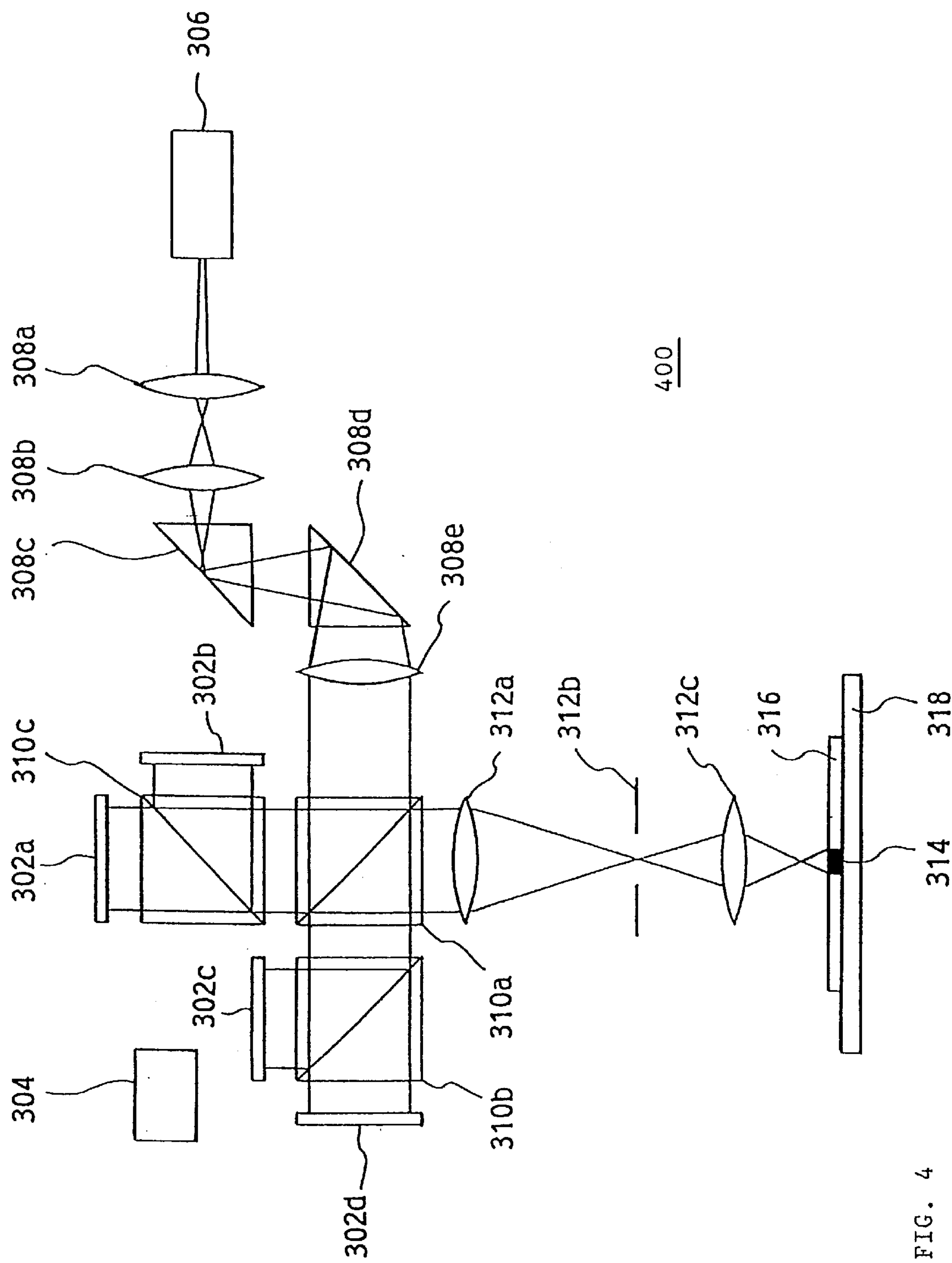
FIG. 4 shows a second embodiment of the device according to the present invention.

A second embodiment of the device according to the present invention will now be described in more detail on the basis of FIG. 4. In FIG. 4 the same reference numerals have been used for the same elements which have already been described in connection with FIG. 3.

The device according to the present invention is designated generally by reference numeral 400.

This device 400 differs from the device depicted in FIG. 3 in that four plane light modulators 302*a*–302*d* are used instead of the two plane light modulators. Accordingly, three beam splitting cubes 310*a*–310*c* are used to distribute the light from the light source 306 onto the individual plane light modulators 302*a*–302*d* and to recombine it again for imaging onto the region to be exposed 314.

In the following the creation of an addressing of a 0.5 μm technology with a required structure element of 0.05 μm will be explained in more detail with respect to the embodiment of FIG. 4.

The width of the picture elements for the plane light modulators 302*a*–302*d* is, for example, 20 μm and the imaging scale of the imaging optical system 312*a*–312*c* is 100:1. The width of a structure increment is thus 0.2 μm. Starting from this structure increment, a reduction by the factor 4 to the required 0.05 μm is achieved by means of the present invention, whereby structure widths of 0.50 μm, 0.55 μm, 0.60 μm, etc. can be exposed.

A 0.55 μm structure arises in the following way: the N−1=3 beam splitters (N=number of plane light modulators) split the laser beam into N=4 subbeams of equal intensity, each of which impinges on its respective assigned plane light modulator 302*a*–302*d*. The structure to be created is subdivided into the sum of an integral multiple of the width of the picture element i×p and a remainder delta p:

$$0.55\ \mu m = i \times p + \text{delta}\ p = 2 \times 0.20\ \mu m + 0.15\ \mu m.$$

The number j is now calculated:

$$j = N \times (\text{delta}\ p/p) = 4 \times (0.15\ \mu m / 0.20\ \mu m) = 3$$

Then i=2 picture elements are addressed for all N=4 plane light modulators and the picture element i+1=3 of the structure is likewise addressed for j=3 plane light modulators and not addressed for the remaining N−j=1 plane light modulators.

Through this addressing of the N=4 plane light modulators a region with a width of 0.55 μm is exposed on the layer to be structured. The coherent superposition already described above occurs also in the embodiment described on the basis of FIG. 4 if the interference conditions are met.

If the interference conditions are not met, the individual partial pictures are superposed incoherently.

It is pointed out that the devices described on the basis of FIG. 3 or 4, in which the various plane light modulators are imaged simultaneously onto the substrate, can be operated in the modes described hereinafter.

In a first operating mode all the plane light modulators (two or more) are identical but are programmed differently or have different patterns.

This operating mode is used in order to reduce the structure increment of the image below the size prescribed by the pixel dimensions on the plane light modulator multiplied by the imaging scale of the imaging optical system, as has already been described above.

In a second operating mode all the plane light modulators are identical and are programmed in the same way or have the same patterns.

This operating mode is used in order to utilize the energy of the light source completely for illuminating plane light modulators, so that the exposure of the substrate with a light energy smaller by a factor of two compared with conventional equipment becomes possible.

In a third operating mode the plane light modulators are not identical.

This operating mode is used when, for particular applications, it is sensible to employ plane light modulators with a rigidly imprinted pattern (passive elements), e.g. for creating patterns with a high degree of structure repetitions. Shutters can be used here to optionally prevent individual plane light modulators (either active matrix-addressable modulators or modulators with passive elements) from being illuminated, so that they do not contribute to the imaging.

What is claimed is:

1. A method for structuring a photolithographic layer, comprising the following steps:

a) creating a first pattern on a first plane light modulator, where the first plane light modulator comprises a plurality of picture elements, where the first pattern is defined by a prescribed number of addressed picture elements;

b) imaging the first pattern onto a region to be exposed of the layer to be structured;

c) creating a second pattern on a second plane light modulator, where the second plane light modulator comprises a plurality of picture elements, where the second pattern comprises a first region of addressed picture elements, which matches the first pattern or part thereof, and immediately adjacent to the first region a second region of addressed picture elements; and d) imaging the second pattern onto the region to be exposed of the layer to be structured;

wherein the first and the second pattern are imaged simultaneously onto the region to be exposed of the layer to be structured; and wherein said first pattern is imaged with a first intensity and said second pattern is imaged with a second intensity, said first and second intensities being below the intensities necessary to image the complete first pattern and the complete second pattern.

2. A method according to claim 1, wherein the second region of the second pattern comprises an addressed picture element at right angles to an extension direction of the first region of the second pattern.

3. A method according to claim 1, wherein the first and the second plane light modulator are illuminated by a light source.

4. A method according to claim 3, wherein a difference in the light paths from the light source via the first and the second plane light modulator to the layer to be structured is less than a coherence length of the light of the light source.

5. A method according to claim 1, wherein the first and the second plane light modulator are illuminated by a first and a second light source, where the first and the second light source interfere with each other.

6. A method according to claim 5, wherein a difference in the light paths from the first light source via the first plane light modulator and from the second light source via the second plane light modulator to the layer to be structured is less than a coherence length of the light of the light sources.

7. A device for structuring a photolithographic layer, comprising:

a first plane light modulator with a plurality of picture elements for creating a first pattern, which is defined by a prescribed number of addressed picture elements;

an imaging device, which images the first pattern onto a region to be exposed of the layer to be structured; and a second plane light modulator with a plurality of picture elements for creating a second pattern, which comprises a first region of addressed picture elements, which matches the first pattern or part thereof, and immediately adjacent to the first region a second region of addressed picture elements;

wherein the imaging device images the second pattern onto the region to be exposed of the layer to be structured;

wherein the imaging device images the first and the second pattern simultaneously onto the region to be exposed of the layer to be structured; and wherein said first pattern is imaged with a first intensity and said second pattern is imaged with a second intensity, said first and second intensities being below the intensities necessary to image the complete first pattern and the complete second pattern.

8. A device according to claim 7, wherein the second region of the second pattern has an addressed picture element at right angles to an extension direction of the first region of the second pattern.

9. A device according to claim 7, further comprising a first light source, which is assigned to the first plane light modulator; and a second light source, which is assigned to the second plane light modulator, whose light can interfere with the light of the first light source.

10. A device according to claim 9, wherein a difference in the light paths from the first light source via the first plane light modulator and from the second light source via the second plane light modulator to the layer to be structured is less than a coherence length of the light of the light sources.

11. A device according to claim 7, comprising a light source; and a beam splitting device which directs the light beam from the light source onto the first and onto the second plane light modulator.

12. A device according to claim 11, wherein a difference in the light paths from the light source via the first and the second plane light modulator to the layer to be structured is less than a coherence length of the light of the light source.

13. A device according to claim 11, wherein the beam splitting device splits the light beam from the light source into two beams of equal light intensity.

14. A device according to claim 9, wherein the light source is a pulsed laser light source.

15. A device according to claim 7, comprising a movable positioning table, on which the layer to be structure can be mounted.

* * * * *